(12) United States Patent
Kim

(10) Patent No.: US 7,061,305 B2
(45) Date of Patent: Jun. 13, 2006

(54) THRESHOLD VOLTAGE DETECTOR FOR PROCESS EFFECT COMPENSATION

(75) Inventor: Jung Pill Kim, Cary, NC (US)

(73) Assignee: Infineon Technologies AG, Munich (DE)

( * ) Notice: Subject to any disclaimer, the term of this patent is extended or adjusted under 35 U.S.C. 154(b) by 28 days.

(21) Appl. No.: 10/826,840

(22) Filed: Apr. 16, 2004

(65) Prior Publication Data

US 2005/0231268 A1    Oct. 20, 2005

(51) Int. Cl.
   *G05F 1/10*    (2006.01)
(52) U.S. Cl. .......................... 327/535; 327/74
(58) Field of Classification Search ................. 326/87; 327/72, 74, 77, 80, 81, 530, 534, 535, 537, 327/538, 539, 540, 541, 543
   See application file for complete search history.

(56) References Cited

U.S. PATENT DOCUMENTS 5,831,472 A * 11/1998 Wang et al. ................ 327/543
6,359,474 B1 * 3/2002 Sato ............................ 327/81
6,407,611 B1 * 6/2002 Larsen et al. ............... 327/362
6,693,449 B1   2/2004 Gorgen

* cited by examiner

*Primary Examiner*—Jeffrey Zweizig
(74) *Attorney, Agent, or Firm*—Dicke, Billig & Czaja, PLLC

(57) ABSTRACT

A process variation compensation circuit and method including a threshold voltage detector circuit, a comparator network, and a circuit block. The threshold voltage detector circuit is configured with at least one transistor that is manufactured during a process. The threshold voltage detector generates an output signal dependant on variations in the process. The comparator network is coupled to the threshold voltage detector. The comparator network receives the output signal and generates responsive logic signals that are indicative of the output signal. The circuit block is coupled to the comparator network and includes at least one transistor manufactured from the process. The circuit block is configured to receive the logic signals and to adjust the circuit block according to the received logic signals.

21 Claims, 6 Drawing Sheets

THRESHOLD VOLTAGE DETECTOR FOR PROCESS EFFECT COMPENSATION

BACKGROUND

The present invention relates to detection and compensation for process variations that can occur during the processing of semiconductor components. Specifically, threshold voltage detectors are used to detect process variations, to quantify the process variations, and to compensate for such variations.

During fabrication of semiconductor components, it is typical for process variation to affect the properties of the manufactured semiconductor components. Process variation of semiconductor components is the normal variance in the structure between semiconductor components of the same type due to variations that occur during manufacturing. Because of process variation, different semiconductor components used in electrical circuits will have performance characteristics that vary and may be degraded, depending on process variations.

In some applications, electrical circuits may be devised in which process variations of semiconductor components can be minimized or designed around. In other instances, it is useful to determine what process variations have occurred in the semiconductor components so that adjustments can be made to the electrical circuit to compensate therefore.

For these and other reason, a need exists for the present invention.

SUMMARY

The present invention is a process variation compensation circuit. The circuit includes a threshold voltage detector circuit, a comparator network, and a circuit block. The threshold voltage detector circuit is configured with at least one transistor that is manufactured during a process. The threshold voltage detector generates an output signal dependant on variations in the process. The comparator network is coupled to the threshold voltage detector. The comparator network receives the output signal and generates responsive logic signals that are indicative of the output signal. The circuit block is coupled to the comparator network and includes at least one transistor manufactured from the process. The circuit block is configured to receive the logic signals and to adjust the circuit block according to the received logic signals.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
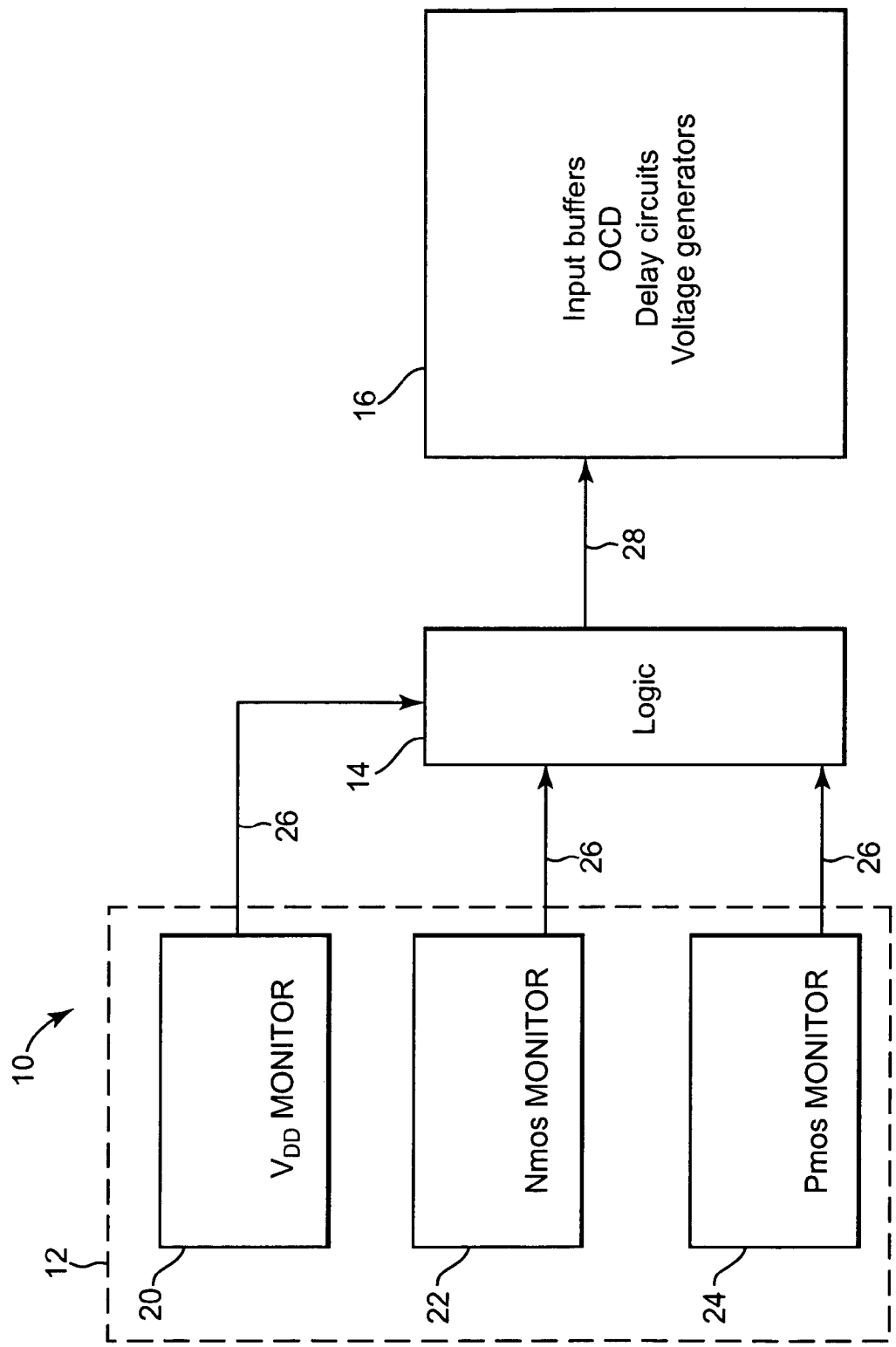
FIG. 1 illustrates a process variation compensation circuit in accordance with the present invention.

FIG. 1 illustrates a process variation compensation circuit 10 in accordance with the present invention. Compensation circuit 10 includes threshold voltage detector 12, logic 14, and circuit block 16.

Threshold voltage detector 12 may be alternatively configured with any of a variety of threshold voltage detectors consistent with the present invention. For example, $V_{DD}$ monitor 20, NMOS monitor 22, or PMOS 24 may be used to monitor threshold voltage in a manufactured semiconductor component. Once threshold voltage detector 12 detects threshold voltage in a manufactured semiconductor component, an output signal 26, such as a threshold voltage signal, is sent to logic 14.

Logic 14 is configured to receive the output signal 26 from threshold voltage detector 12. Logic 14 then digitizes output signal 26 and generates a digital signal 28 representative of output signal 26, and sends digital signal 28 to circuit block 16.

Circuit block 16 is configured to receive digital signal 28 such that adjustments may be made to circuit block 16 based on the digital signal 28. Circuit block 16 may be a variety of configurations, such as input buffers, off-chip drivers (OCD), delay circuits, voltage generators, and various other circuit configurations.

In one embodiment, threshold voltage detector 12 of compensation circuit 10 includes at least one semiconductor component, such as a transistor, that has been fabricated during a manufacturing process. Threshold voltage detector 12 derives a threshold voltage signal, which is the output signal 26 of threshold voltage detector 12. Threshold voltage detector 12 is configured such that the detected threshold voltage signal is dependant on, and will vary in accordance with, the characteristics of the semiconductor component within threshold voltage detector 12. In one embodiment, the detected threshold voltage signal will increase or decrease depending on the process effects of the semiconductor component.

This variable threshold voltage signal is sent as output signal 26 to logic 14 and converted to a digital representation (as logic signal 28) by logic 14. These digital signals 28 are received by circuit block 16. In one embodiment, circuit block 16 is a buffer or related circuit device that includes at least one semiconductor component, such as a transistor, that has been fabricated during the same manufacturing process as the semiconductor component of threshold voltage detector 12. Using digital signals 28, process variation of the semiconductor component in circuit block 16 can be compensated for, and desired target characteristics can be held.

Figure 2:
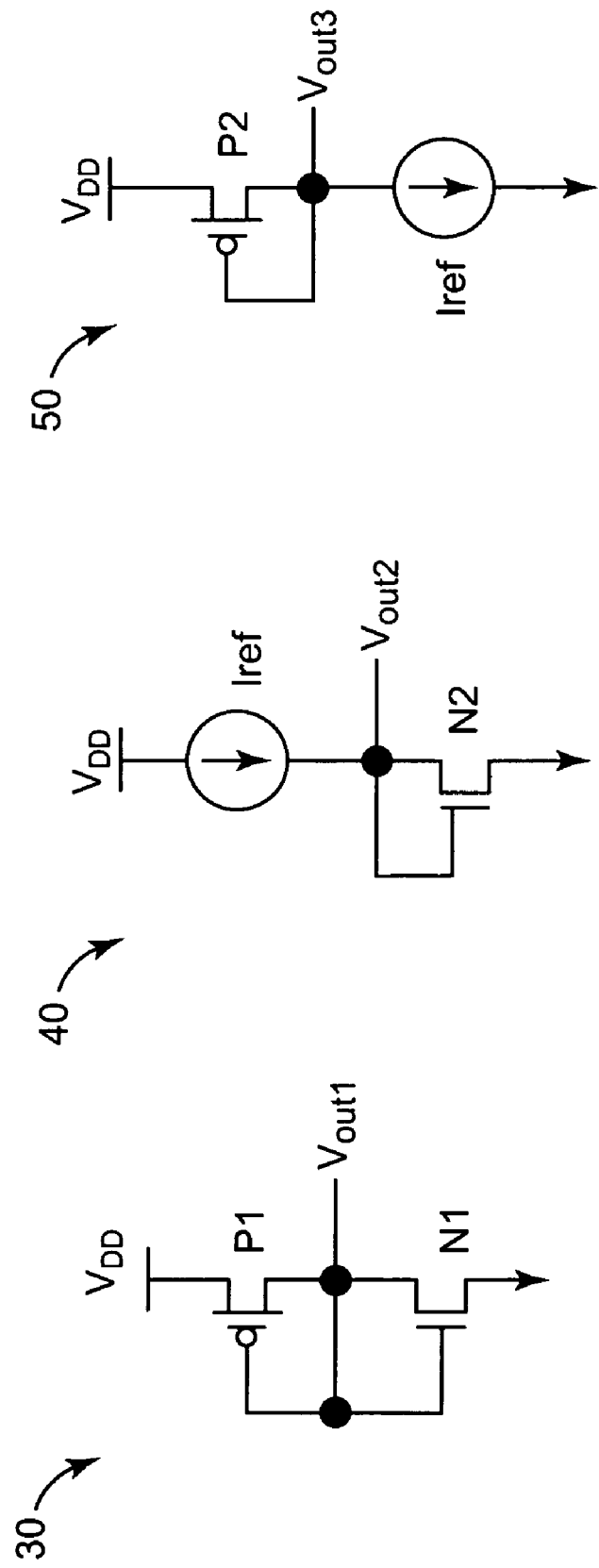
FIGS. 2A–2C illustrate alternative threshold voltage detector circuits for use in process variation compensation circuits in accordance with the present invention.

FIGS. 2A–2C illustrate threshold voltage detectors 30, 40 and 50 in accordance with the present invention. FIG. 2A illustrates inverter threshold voltage detector 30. Inverter threshold voltage detector 30 includes PMOS transistor P1 and NMOS transistor N1 configured as an inverter between power supply voltage $V_{DD}$ and ground. Each of transistors P1 and N1 include input, output, and control gates. The input gate of transistor P1 is coupled to power supply voltage $V_{DD}$, and the output gate of transistor P1 is coupled to the output gate of transistor N1. The input gate of transistor N1 is coupled to ground. The control gates of both transistors N1 and P1 are coupled together to the output gates of transistors N1 and P1, and together all form the output node voltage $V_{out1}$.

For inverter threshold voltage detector 30, output node voltage $V_{out1}$ is the threshold voltage of the detector. For inverter threshold voltage detector 30, the output node voltage $V_{out1}$ can be described with the following equation:

$$Vout1 = \frac{\beta_p}{\beta_p + \beta_n} V_{DD} + \frac{\beta_n}{\beta_p + \beta_n} V_{TN} - \frac{\beta_p}{\beta_p + \beta_n} V_{TP}$$

where $\beta_p$ and $\beta_n$ are the beta values for the PMOS and NMOS transistors respectively, where $V_{TN}$ and $V_{TP}$ are the transistor threshold voltages for the PMOS and NMOS transistors, respectively, and where $V_{DD}$ is the power supply voltage.

In one embodiment of inverter threshold voltage detector 30, NMOS transistor N1 and PMOS transistor P1 are designed such that the beta ratio between them is equal to 1. Consequently, where the beta ratio equals 1, the output node voltage $V_{out1}$ can be described as follows:

$$Vout1 = 0.5*V_{DD} + 0.5*V_{TN} - 0.5*V_{TP}$$

In this way, in those cases where the threshold voltage of PMOS transistor P1 ($V_{TP}$) and the threshold voltage of NMOS transistor N1 ($V_{TN}$) are the same, the output of the inverter threshold voltage detector 30 is equal to ½ $V_{DD}$.

In some cases, variation to semiconductor characteristics caused by process variation will likewise cause changes in the threshold voltage $V_{TP}$ of PMOS transistor P1 and/or to the threshold voltage $V_{TN}$ of NMOS transistor N1. Because of this relationship between process variation and threshold voltage of the transistors, the above formula can be used to determine process variation by the value of output node voltage $V_{out1}$ of inverter threshold voltage detector 30.

Accordingly, when process variation causes the threshold voltage $V_{TN}$ of the NMOS transistor N1 to be larger than the threshold voltage $V_{TP}$ of NMOS transistor N1, then the output node voltage $V_{out1}$ of inverter threshold voltage detector 30 will be higher than ½ $V_{DD}$. When process variation causes the threshold voltage $V_{TP}$ of PMOS transistor P1 to be larger than the threshold voltage $V_{TN}$ of NMOS transistor, then the output node voltage $V_{out1}$ of inverter threshold voltage detector 30 will be lower than ½ $V_{DD}$. In this way, inverter threshold voltage detector 30 will track the process variation of the inverter threshold voltage.

In one embodiment, this output node voltage $V_{out1}$ of inverter threshold voltage detector 30 is output signal 26 and is converted to digital signal 28 in by logic 14 (illustrated in FIG. 1). These digital signals 28 are then used to compensate for process variation of the semiconductor components used in circuit block 16 in order to hold desired target characteristics for circuit block 16.

FIG. 2B illustrates NMOS threshold voltage detector 40 in accordance with an alternative embodiment of the present invention. NMOS threshold voltage detector 40 includes NMOS transistor N2 and current source $I_{REF}$ connected between power supply voltage $V_{DD}$ and ground. NMOS transistor N2 includes an input gate, an output gate and a control gate. Current source $I_{REF}$ is connected between power supply voltage $V_{DD}$ and the output gate of transistor N2. The input gate of transistor N2 is coupled to ground. The output gate and control gate of transistor N2 are coupled form the output node voltage $V_{out2}$.

Similar to the above-described relationship for inverter threshold voltage detector 30, output node voltage $V_{out2}$ for NMOS threshold voltage detector 40 can be expressed as follows:

$$Vout2 = \sqrt{\frac{Iref}{\beta_N}} + V_{TN}$$

where $\beta_N$ is the beta value for NMOS transistor N2, where $V_{TN}$ is the transistor threshold voltage for the NMOS transistor N2, and where $I_{REF}$ is the reference current. $I_{REF}$ and $\beta_N$ are constant values, and in one embodiment, $I_{REF}$ is selected to be small and $\beta_N$ is selected to be large such that the entire first component of the above equation drops out. In this way, output node voltage $V_{out2}$ for NMOS threshold voltage detector 40 varies with changes in NMOS threshold voltage $V_{TN}$. Thus, as with inverter threshold voltage detector 30, NMOS threshold voltage detector 40 can also be used to detect threshold voltage variation due to process variation in the manufacturing of NMOS transistors.

In one embodiment, this output node voltage $V_{out2}$ for NMOS threshold voltage detector 40 is output signal 26 and is converted to digital signal 28 in by logic 14 (illustrated in FIG. 1). These digital signals 28 are then used to compensate for process variation of the semiconductor components used in circuit block 16 in order to hold desired target characteristics for circuit block 16.

FIG. 2C illustrates PMOS threshold voltage detector 50 in accordance with an alternative embodiment of the present invention. PMOS threshold voltage detector 50 includes PMOS transistor P2 and current source $I_{REF}$ connected between power supply voltage $V_{DD}$ and ground. PMOS transistor P2 includes an input gate, an output gate and a control gate. Current source $I_{REF}$ is connected between the output gate of transistor P2 and ground. The input gate of transistor P2 is coupled to power supply voltage $V_{DD}$. The output gate and control gate of transistor P2 are coupled form the output node voltage $V_{out3}$.

Similar to the above-described relationships for inverter threshold voltage detector 30 and NMOS threshold voltage detector 40, output node voltage $V_{out3}$ for PMOS threshold voltage detector 50 can be expressed as follows:

$$Vout3 = \sqrt{\frac{2Iref}{\beta_p}} + V_{DD} - V_{Tp}$$

where $\beta_P$ is the beta value for PMOS transistor P2, where $V_{TP}$ is the transistor threshold voltage for the PMOS transistor P2, where $I_{REF}$ is the reference current, and where $V_{DD}$ is the power supply voltage. Again, $I_{REF}$ and $\beta_P$ are constant values, and in one embodiment, $I_{REF}$ is selected to be small and $\beta_P$ is selected to be large such that the entire first component of the above equation drops out. Also, since $V_{DD}$ is a known constant value, output node voltage $V_{out3}$ for PMOS threshold voltage detector 50 varies with changes in PMOS threshold voltage $V_{TP}$. Thus, as with inverter threshold voltage detector 30 and NMOS threshold voltage detector 40, PMOS threshold voltage detector 50 can also be used to detect threshold voltage variation due to process variation in the manufacturing of PMOS transistors.

In one embodiment, this output node voltage $V_{out3}$ for PMOS threshold voltage detector 50 is output signal 26 and is converted to digital signal 28 in by logic 14 (illustrated in FIG. 1). These digital signals 28 are then used to compensate for process variation of the semiconductor components used in circuit block 16 in order to hold desired target characteristics for circuit block 16.

Figure 3:
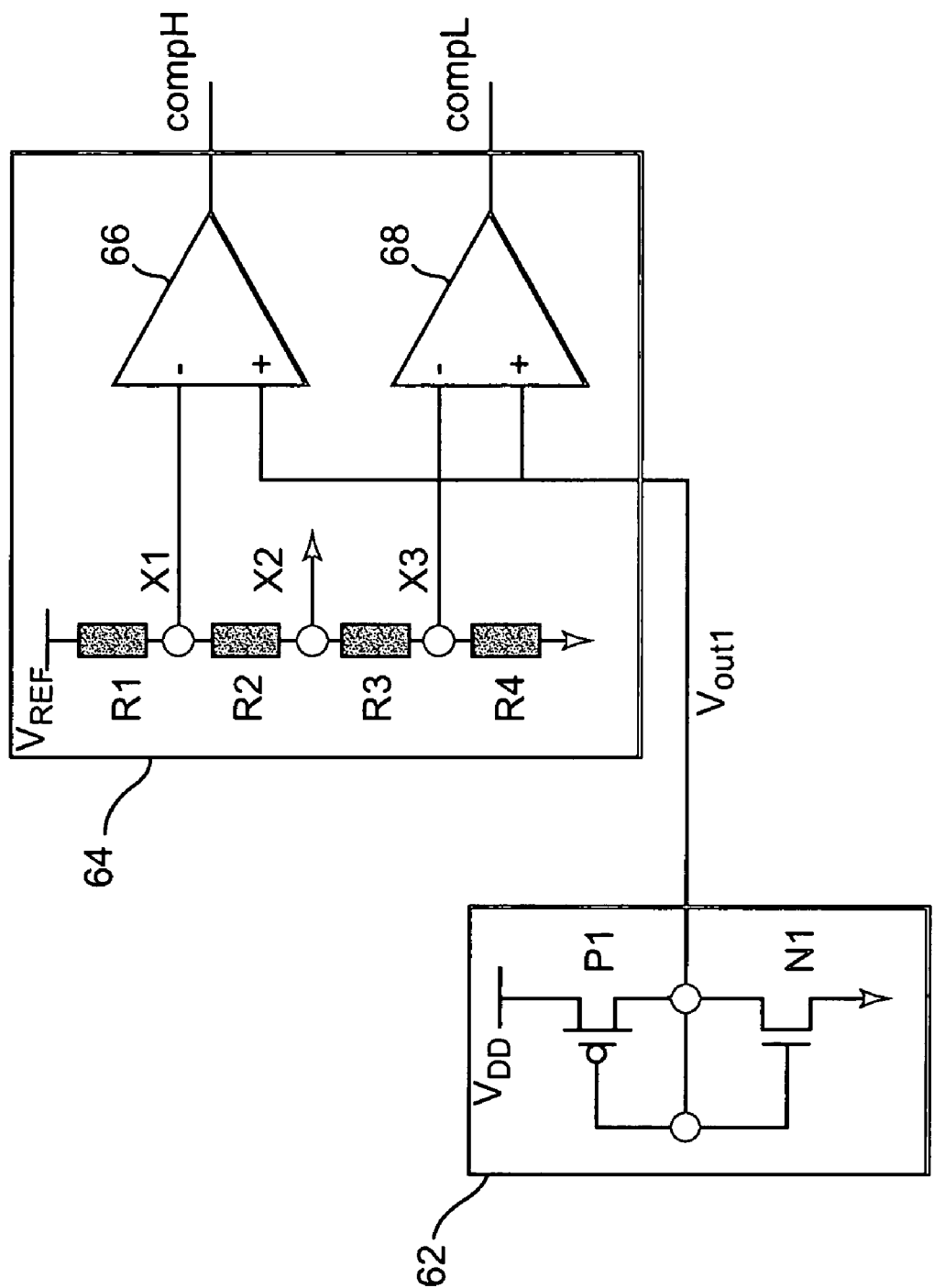
FIG. 3 illustrates a threshold voltage detector circuit and analog-to-digital converter circuit in accordance with the present invention.

FIG. 3 illustrates threshold voltage detector 62 in conjunction with analog-to-digital converter 64. In the exemplary embodiment shown, threshold voltage detector 62 is configured as an inverter threshold voltage detector including PMOS transistor P1 and NMOS transistor N2 as illustrated and described above with respect to FIG. 2A. In alternative embodiments, threshold voltage detector 62 can also be in the form of NMOS threshold voltage detector 40 (illustrated in FIG. 2B), PMOS threshold voltage detector 50 (illustrated in FIG. 2C), or other threshold voltage detectors.

The detected output voltage $V_{out1}$ from threshold voltage detector 62 is received by analog-to-digital converter 64. Analog-to-digital converter 64 includes resistors R1, R2, R3, and R4, and high and low comparators 66 and 68. Resistors R1–R4 are configured as a voltage reference network and are coupled between reference voltage $V_{REF}$ and ground. Resistor R1 is coupled to resistor R2 thereby defining first node X1. Resistor R2 is coupled to resistor R3 thereby defining second node X2. Resistor R3 is coupled to resistor R4 thereby defining third node X3. In this way, various reference voltages are made available to high and low comparators 66 and 68 via first through third nodes X1, X2, and X3.

High and low comparators 66 and 68 are each configured with a positive input, a negative input and an output. The output of high comparator 66 provides a compH output signal and the output of low comparator 68 provides a compL output signal. In one exemplary embodiment, first node X1 between reference resistors R1 and R2, provides a reference voltage of 1.1 volts to the negative input of high comparator 66. Third node X3, between reference resistors R3 and R4, provides 0.9 volts to the negative input of low comparator 68. A target voltage of 1.0 volts is provided at second node X2, between reference resistors R2 and R3. The detected output voltage $V_{out1}$ from threshold voltage detector 62 is provided to the positive input of both high and low comparators 66 and 68.

In operation, use of threshold voltage detector 62 in conjunction with analog-to-digital converter 64 facilitates generation of digital signals representative of changes in threshold voltage, which in turn, represents process variation of the semiconductor components. In the exemplary embodiment, the detected output voltage $V_{out1}$ is equal to the target threshold voltage, which is 1.0 volts at second node X2. Since the detected output voltage $V_{out1}$ at the positive input of high comparator 66 is lower than the 1.1 volts at first node X1 received by the negative input of comparator 66, the output of high comparator 66 (compH) is low. Since detected output voltage $V_{out1}$ at the positive input of low comparator 68 is greater than the 0.9 volts at third node X2 received by the negative input of low comparator 68, the output of low comparator 68 (compL) is high. In this way, respective low and high signals for compH and compL indicate that detected output voltage $V_{out1}$ is within target range. This may indicate that no adjustments need to be made in circuit block 16.

In those situations where process variation occurs, however, threshold voltage detector 62 will be affected such that detected output voltage $V_{out1}$ will increase or decrease. If the threshold voltage $V_{TN}$ for NMOS transistor N1 is larger than the threshold voltage $V_{TP}$ for PMOS transistor P1, then detected output voltage $V_{out1}$ increases from the target threshold voltage. In this case, detected output voltage $V_{out1}$ received by the positive input of high comparator 66 is greater than the 1.1 volts at first node X1 such that the output of high comparator 66 compH changes to high. Since detected output voltage $V_{out1}$ received by the positive input of low comparator 68 remains higher than the 0.9 volts at third node X3 received by the negative input to low comparator 68, the output of low comparator 68 compL remains high. In this way, respective high and high signals for compH and compL indicate that detected output voltage $V_{out1}$ above target range. This may indicate that adjustments should be made in circuit block 16.

If the threshold voltage $V_{TP}$ of PMOS transistor P1 is larger than the threshold voltage $V_{TN}$ of NMOS transistor N1, then detected output voltage $V_{out1}$ becomes lower than the target threshold voltage. In this case, detected output voltage $V_{out1}$ received by the positive input of high comparator 66 is lower than the 1.1 volts at first node X1 received by the negative input of high comparator 66 such that the output of high comparator 66 compH is low. Since detected output voltage $V_{out1}$ received by the positive input of low comparator 68 is lower than the 0.9 volts at third node X3 received by the negative input of low comparator 68, the output of low comparator 68 compL is low. In this way, respective low and low signals for compH and compL indicate that detected output voltage $V_{out1}$ below target range. This may indicate that adjustments should be made in circuit block 16.

The following table summarizes the output logic signals compH and compL from high and low comparators 66 and 68 for changes in detected output voltage $V_{out1}$:

| Output Voltage | CompH | CompL | Result |
|---|---|---|---|
| $V_{out1} > 1.1$ V | H | H | Strong PMOS |
| $0.9 < V_{out1} < 1.1$ V | L | H | Normal Range |
| $V_{out1} < 0.9$ V | L | L | Strong NMOS |

Thus, as indicated in the above-table, the status of the threshold voltage of the processed semiconductors is determined from using inverter threshold voltage detector 30 and converting the output signal to digital signals with analog-to-digital converter 64. These digital signals may then be used to appropriately adjust circuit block 16 in accordance with the detected process variation.

In the same way, NMOS threshold voltage detector 40 and PMOS threshold voltage detector 50 as illustrated in FIGS. 2B and 2C can also be configured to be coupled to an analog-to-digital converter such as analog-to-digital converter 64. Thus, detected output voltages $V_{out2}$ and $V_{out3}$ from NMOS and PMOS threshold voltage detectors 40 and 50 can be sent to analog-to-digital converter 64 such that high and low comparator 66 and 68, which are also coupled to a voltage reference network, produce digital signals representative of the detected output voltages $V_{out2}$ and $V_{out3}$.

Where the same values of 1.1V, 1.0V and 0.9V are used for first, second and third nodes X1, X2, and X3 as explained in detail above with respect to inverter threshold voltage detector, digital signals from an analog-to-digital converter receiving detected output voltage $V_{out2}$ NMOS threshold voltage detectors 40 result in the following:

| Output Voltage | CompH | CompL | Result |
| --- | --- | --- | --- |
| $V_{out2}$ > 1.1 V | H | H | Weak NMOS |
| 0.9 V < $V_{out2}$ < 1.1 V | L | H | Normal NMOS |
| $V_{out2}$ < 0.9 V | L | L | Strong NMOS |

Thus, as indicated in the above-table, the status of the threshold voltage of the processed semiconductors is determined from using NMOS threshold voltage detector 40 and converting the output signal to digital signals with analog-to-digital converter 64. These digital signals indicate whether the semiconductors have weak, normal or strong NMOS, and may then be used to appropriately adjust circuit block 16 in accordance with the detected process variation.

Similarly, where the same values of 1.1V, 1.0V and 0.9V are used for first, second and third nodes X1, X2, and X3, digital signals from an analog-to-digital converter receiving detected output voltage $V_{out3}$ PMOS threshold voltage detectors 50 result in the following:

| Output Voltage | CompH | CompL | Result |
| --- | --- | --- | --- |
| $V_{out3}$ > 1.1 V | H | H | Strong PMOS |
| 0.9 V < $V_{out3}$ < 1.1 V | L | H | Normal PMOS |
| $V_{out3}$ < 0.9 V | L | L | Weak PMOS |

Thus, as indicated in the above-table, the status of the threshold voltage of the processed semiconductors is determined from using PMOS threshold voltage detector 50 and converting the output signal to digital signals with analog-to-digital converter 64. These digital signals indicate whether the semiconductors have strong, normal or weak PMOS, and may then be used to appropriately adjust circuit block 16 in accordance with the detected process variation.

Figure 4:
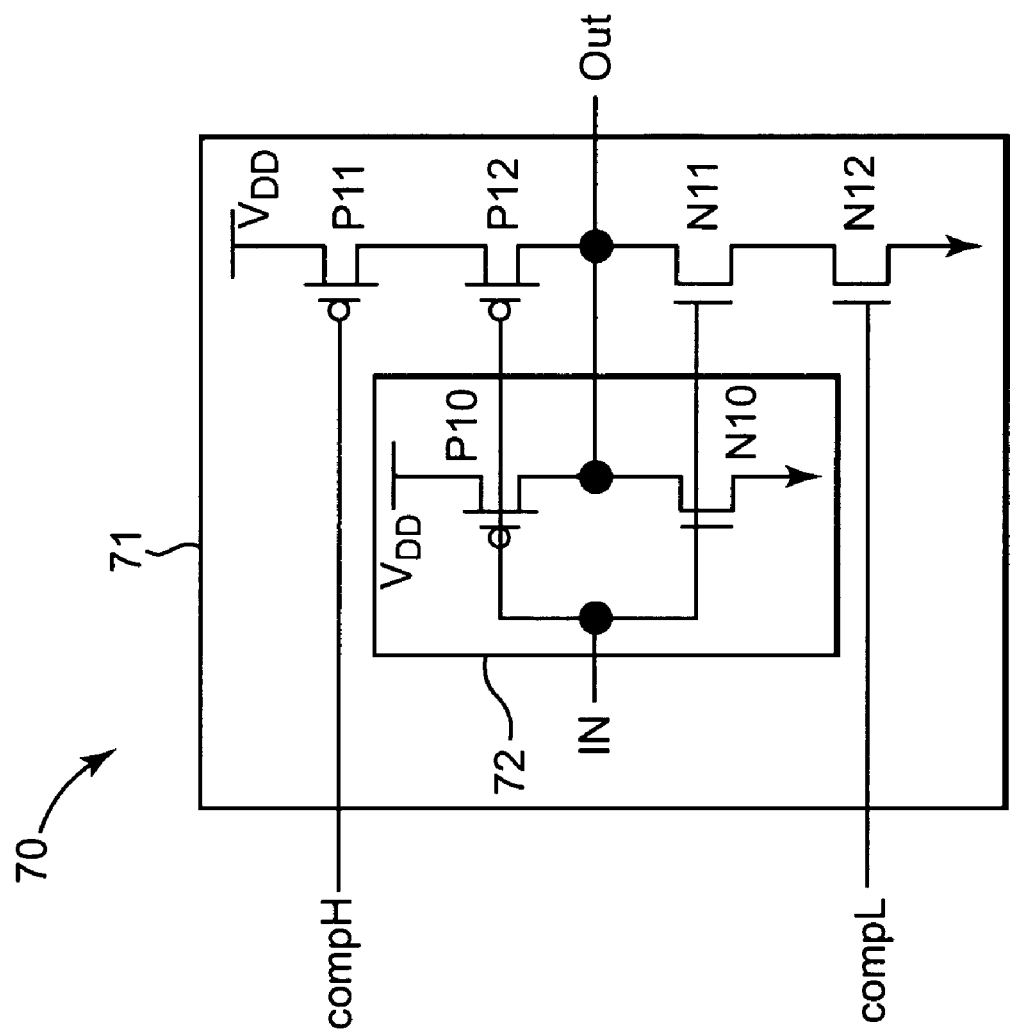
FIG. 4 illustrates one embodiment of a circuit block in a process variation compensation circuit in accordance with the present invention.

FIG. 4 illustrates one embodiment of a process variation compensation circuit 70 in accordance with the present invention. Compensation circuit 70 includes circuit block 71, which receives logic signals and produces output signal (Out). In one embodiment, logic signals received by circuit block 71 are compH and compL logic signal, which are generated by an analog-to-digital converter that is in turn coupled to a threshold voltage detector as explained above with respect to inverter threshold voltage detector 30. The threshold voltage detector detects threshold voltage variation due to process effects and digitizes such variation in the form of compH and compL signals as explained above with respect to analog-to-digital converter 64 illustrated in FIG. 3 and also discussed above.

Circuit block 71 of compensation circuit 70 includes inverter 72, having PMOS transistor P10 and NMOS transistor N10 configured between power supply voltage $V_{DD}$ and ground. Both transistors P10 and N10 have an input, an output and a control gate. The control gates of transistors P10 and N10 are coupled together as the input (IN) to inverter 72. The output gates of transistors P10 and N10 are coupled together as the output (Out) to inverter 72. The input gates of transistors P10 and N10 are coupled to power supply voltage $V_{DD}$ and ground, respectively.

Circuit block 71 of compensation circuit 70 also includes PMOS transistors P11 and P12 and NMOS transistors N11 and N12. Each of these transistors P11, P12, N11 and N12 have an input, an output and a control gate. The input gate of transistor P11 is coupled to power supply voltage $V_{DD}$, and the output gate of transistor P11 is coupled to the input gate of transistor P12. The output gate of transistor P12 is coupled to the output gate of transistor N11. The input gate of transistor N11 is coupled to the output gate of transistor N12. The input gate of transistor N12 is coupled to ground. The output gates of transistors P12 and N11 are coupled to the output gates of transistors P10 and N10, which are also coupled together as the output (Out) of inverter 72.

The control gates of transistors P12 and N11 are coupled to the control gates of transistors P10 and N10, respectively, which are in turn coupled together as the input (IN) of inverter 72. The control gate of transistor P11 receives the compH signal from an analog-to-digital converter and the control gate of transistor N12 receives the compL signal from an analog-to-digital converter.

In operation, circuit block 71 of compensation circuit 70 can be used to automatically compensate for variations that may occur in the manufacturing process of the semiconductors, such as transistors, used in circuit 70.

As indicated above, in the case where inverter threshold voltage detector 30 is used, logic signals compH and compL will be respectively high and high when process effects result in strong PMOS relative to NMOS, respectively low and high when process effect result in normal PMOS and NMOS, and will be respectively low and low when process effects result in strong NMOS relative to PMOS.

In this way, when there is strong PMOS relative to NMOS as a result of process effect, transistor P11 is off and thus transistor P12 is off. Also, when there is strong PMOS, transistor N12 is on, which adds transistor N11 to inverter 72 thereby compensating for the strong PMOS caused by process effect.

When there is normal PMOS and NMOS, transistor P11 is on, which adds transistor P12 to inverter 72. Also, when there normal PMOS and NMOS, transistor N12 is on, which adds transistor N11 to inverter 72. Thus, inverter 72 remains balanced where process effect has not caused transistors to leave a normal range.

Finally, when there is strong NMOS relative to PMOS as a result of process effects, transistor N12 is off and thus transistor N11 is off. Also, when there is strong NMOS, transistor P11 is on, which adds transistor P12 to inverter 72 thereby compensating for the strong NMOS caused by process effect.

Such compensation in circuit block 71 of compensation circuit 70 can stabilize input buffer characteristics. Where no compensation is made, setup and hold time of input signals can be badly affected by variations in the threshold voltages of the semiconductor components. Compensation circuit 70 automatically stabilizes buffer characteristics by monitoring threshold voltage and automatically adjusting the circuit accordingly.

Figure 5:
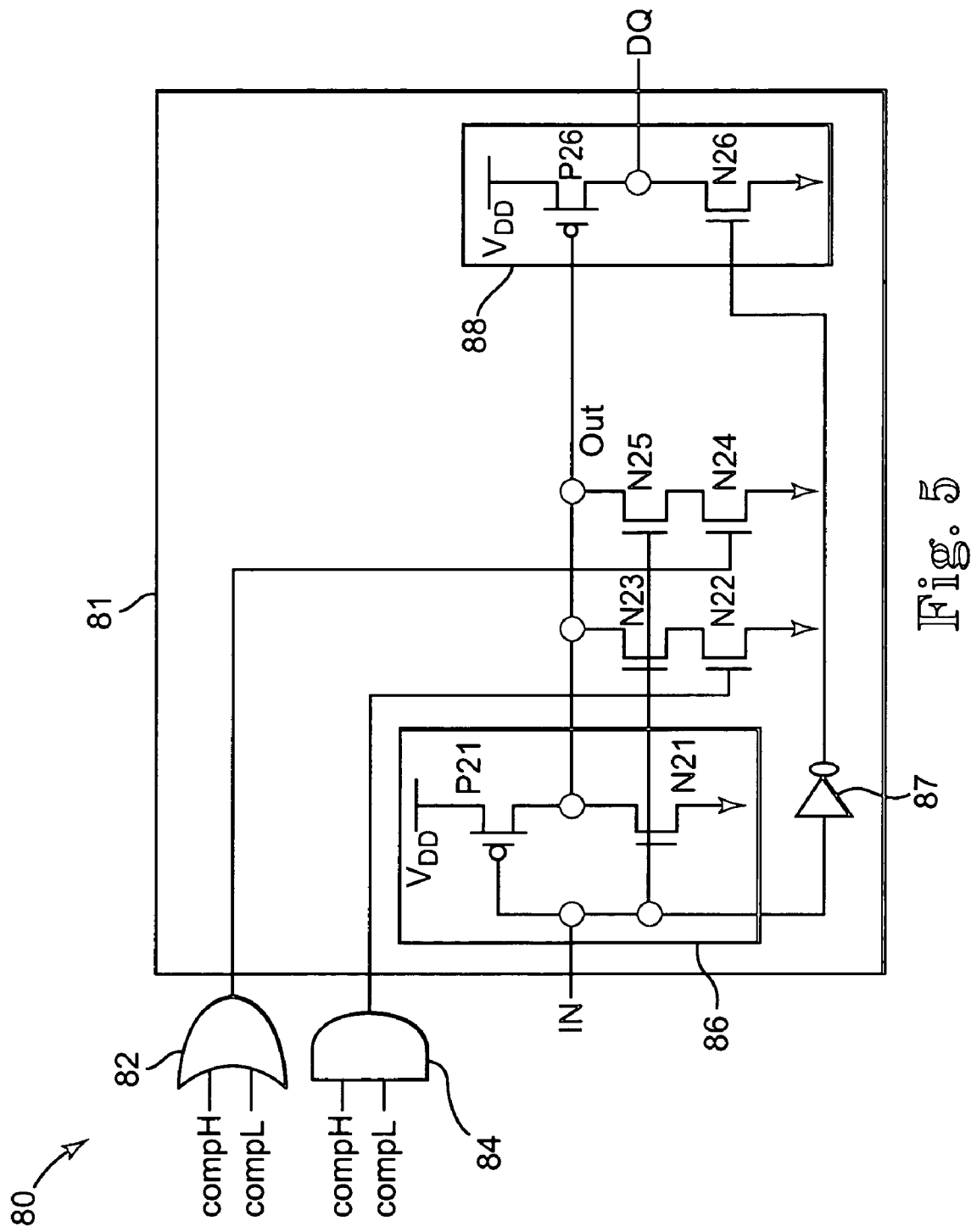
FIG. 5 illustrates an alternative embodiment of a circuit block in a process variation compensation circuit in accordance with the present invention.

FIG. 5 illustrates a process variation compensation circuit 80 in accordance with another embodiment of the present invention. Compensation circuit 80 includes circuit block 81, OR gate 82 and AND gate 84. OR gate 82 and AND gate 84 are each configured to receive compH and compL signals, which are generated by an analog-to-digital converter that is in turn coupled to a threshold voltage detector as explained above with respect to NMOS threshold voltage detector 40. The NMOS threshold voltage detector 40 detects threshold voltage variation due to process effects and digitizes such variation in the form of compH and compL signals as explained above with respect to analog-to-digital converter 64 illustrated in FIG. 3 and also discussed above.

Circuit block 81 of compensation circuit 80 in configured to receive the output from logic gates 82 and 84 and produces driver signal (DQ). Circuit block 81 includes inverter 86, having PMOS transistor P21 and NMOS transistor N21 configured between power supply voltage $V_{DD}$ and ground. Both transistors P21 and N21 have an input, an output and a control gate. The control gates of transistors P21 and N21 are coupled together as the input (IN) of logic circuit 86. The output gates of transistors P21 and N21 are coupled together as the output (Out) of inverter 86. The input gates of transistors P21 and N21 are coupled to power supply voltage $V_{DD}$ and ground, respectively.

Circuit block 81 of compensation circuit 80 includes DQ driver circuit 88, having PMOS transistor P26 and NMOS transistor N26 configured between power supply voltage $V_{DD}$ and ground. Both transistors P26 and N26 have an input, an output and a control gate. The output gates of transistors P26 and N26 are coupled together as the output (DQ) to DQ driver circuit 88. The control gate of transistor P26 is coupled back to the coupled output gates of transistors P21 and N21, which is the output (Out) of inverter 86. The control gate of transistor N26 is coupled back to the coupled control gates of transistors P21 and N21, which is the input (IN) of inverter 86. In one embodiment, the control gate of transistor N26 is coupled back to the input (IN) of inverter 86 through inverter 87.

Circuit block 81 of compensation circuit 80 also includes NMOS transistors N22, N23, N23 and N25. Each of these transistors N22, N23, N24 and N25 have an input, an output and a control gate. Transistors N22 and N23 are coupled between the output of inverter 86 and ground, and transistors N24 and N25 are also coupled between the output of inverter 86 and ground. The output gate of transistors N23 and N25 are coupled to the output of inverter 86, which is in turn coupled to the control gate of transistor P26. The input gate of transistors N23 and N25 are coupled to output gate of transistors N22 and N24, respectively. The input gates of transistors N22 and N24 are coupled to ground.

The control gates of transistors N23 and N25 are coupled to the control gate of transistor N21, which is in turn coupled as the input (IN) of inverter 86. The control gate of transistor N22 receives the output from AND gate 84 and the control gate of transistor N24 receives the output from OR gate 82.

In operation of one embodiment, compensation circuit 80 can be used as an off-chip driver circuit for a memory or other device. Compensation circuit 80 automatically compensates for variations that may occur in the manufacturing process of the transistors used in circuit 80. In the case where NMOS threshold voltage detector 40 (illustrated in FIG. 2B) is used in conjunction with analog-to-digital converter 64 (illustrated in FIG. 3), logic signals compH and compL will be respectively high and high when process effects result in weak NMOS, respectively low and high when process effect result in normal NMOS, and will be respectively low and low when process effects result in a strong NMOS.

In this way, when there is weak NMOS as a result of process effect, the output of OR gate 82 is high such that transistor N24 is on, which adds transistor N25 to inverter 86, and the output of AND gate 84 is high such that transistor N22 is on, which adds transistor N23 to inverter 86. The adding of both transistors N23 and N25 compensates for the weak NMOS caused by the process effect.

When there is normal NMOS, the output of OR gate 82 is high such that transistor N24 is on, which adds transistor N25 to inverter 86, and the output of AND gate 84 is low such that transistor N22 is off, which removes transistor N23 from inverter 86. Adding only transistor N23 retains the balance where the process effect has not caused transistors to leave a normal range.

Finally, when there is strong NMOS as a result of process effect, the output of OR gate 82 is low such that transistor N24 is off, which removes transistor N25 from inverter 86, and the output of AND gate 84 is low such that transistor N22 is off, which removes transistor N23 from inverter 86. Adding neither transistor N23 nor transistor N25 compensates for the strong NMOS caused by the process effect.

Such compensation in circuit block 81 of compensation circuit 80 can adjust slew rate according to process variation in the semiconductor components. Thus, where the NMOS threshold voltage is low and the slew rate increases, the driver size of DQ driver circuit 88 is reduced by turning off transistor N24. Where the NMOS threshold voltage is high and the slew rate decreases, the driver size of DQ driver circuit 88 is increased by turning on transistor N22. In this way, using NMOS threshold voltage detector 40, and analog-to-digital converter 64, the slew rate of circuit block 81 is adjusted.

Figure 6:
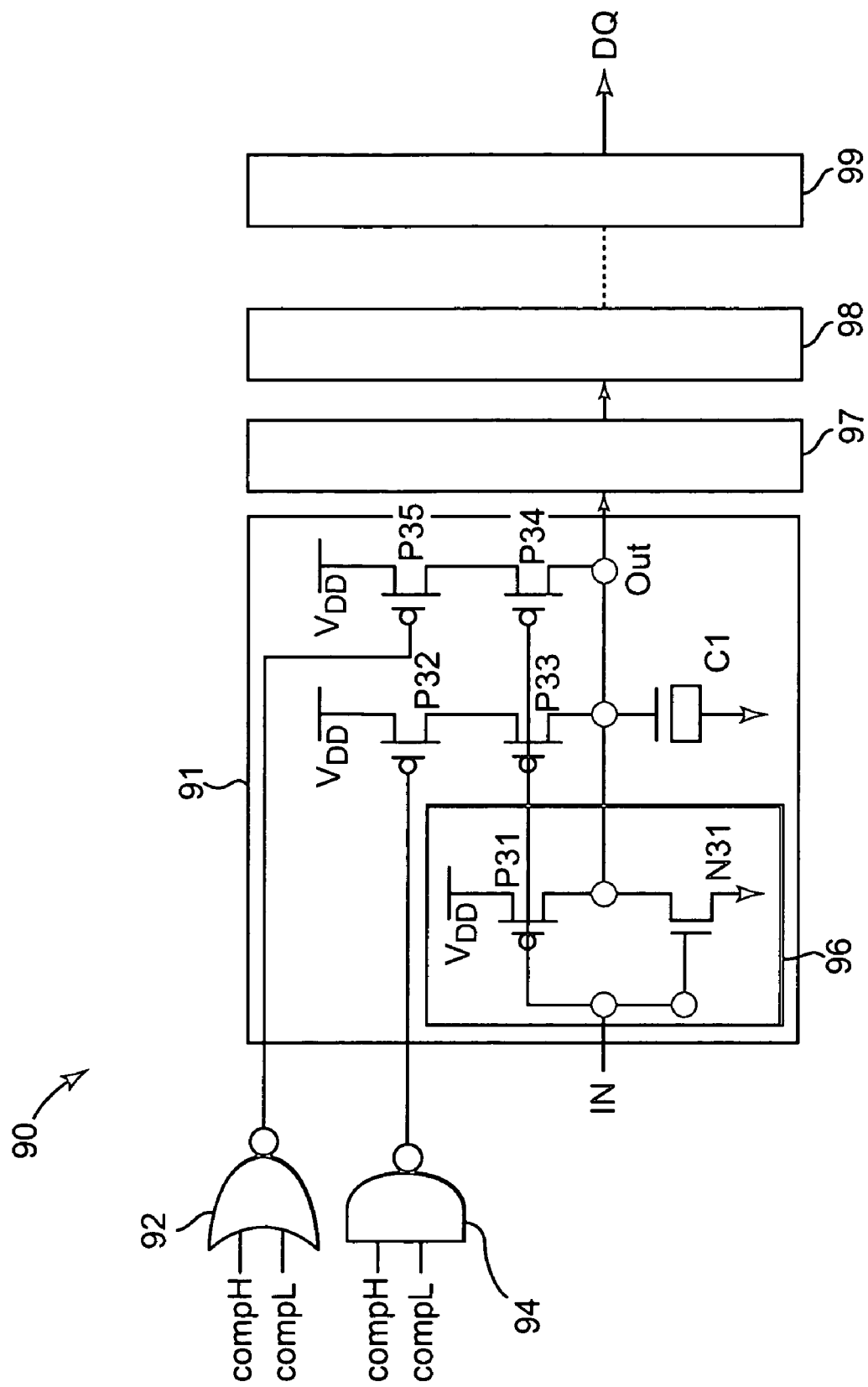
FIG. 6 illustrates an alternative embodiment of a circuit block in a process variation compensation circuit in accordance with the present invention.

FIG. 6 illustrates a process variation compensation circuit 90 in accordance with another embodiment of the present invention. Compensation circuit 90 includes circuit block 91, NOR gate 92 and NAND gate 94. NOR gate 92 and NAND gate 94 are each configured to receive compH and compL signals, which are generated by an analog-to-digital converter that is in turn coupled to a threshold voltage detector as explained above with respect to PMOS threshold voltage detector 50. The PMOS threshold voltage detector 50 detects threshold voltage variation due to process effects and digitizes such variation in the form of compH and compL signals as explained above with respect to analog-to-digital converter 64 illustrated in FIG. 3 and also discussed above.

Circuit block 91 of compensation circuit 90 in configured to receive the output from logic gates 92 and 94 and produces driver signal (DQ). Circuit block 91 includes inverter 96, having PMOS transistor P31 and NMOS transistor N31 configured between power supply voltage $V_{DD}$ and ground. Both transistors P31 and N31 have an input, an output and a control gate. The control gates of transistors P31 and N31 are coupled together as the input (IN) of inverter 96. The output gates of transistors P31 and N31 are coupled together as the output (Out) of inverter 96. The input gates of transistors P31 and N31 are coupled to power supply voltage $V_{DD}$ and ground, respectively.

Circuit block 91 of compensation circuit 90 also includes PMOS transistors P32, P33, P33 and P35. Each of these transistors P32, P33, P33 and P35 have an input, an output and a control gate. Transistors P32 and P33 are coupled between the output (Out) of inverter 96 and power supply voltage V$_{DD}$, and transistors P34 and P35 are also coupled between the output (Out) of inverter 96 and power supply voltage V$_{DD}$. The output gate of transistors P33 and P34 are coupled to the output (Out) of inverter 96, which is in turn coupled to capacitor C1. The input gate of transistors P33 and P34 are coupled to output gate of transistors P32 and P34, respectively. The input gates of transistors P32 and P35 are coupled to power supply voltage V$_{DD}$.

The control gates of transistors P33 and P34 are coupled to the control gate of transistor P31, which is in turn coupled as the input (IN) of inverter 96. The control gate of transistor P32 receives the output from NAND gate 94 and the control gate of transistor P35 receives the output from NOR gate 92.

In operation of one embodiment, compensation circuit 90 can be used as an off-chip driver circuit for a memory or other device. Compensation circuit 90 automatically compensates for variations that may occur in the manufacturing process of the transistors used in circuit 90. In the case where PMOS threshold voltage detector 50 (illustrated in FIG. 2B) is used in conjunction with analog-to-digital converter 64 (illustrated in FIG. 3), logic signals compH and compL will be respectively high and high when process effects result in strong PMOS, respectively low and high when process effect result in normal PMOS, and will be respectively low and low when process effects result in a weak PMOS.

In this way, when there is strong PMOS as a result of process effect, the output of NOR gate 92 is low such that transistor P35 is on, which adds transistor P34 to inverter 96, and the output of NAND gate 94 is low such that transistor P32 is on, which adds transistor P33 to inverter 96. The adding of both transistors P32 and P34 compensates for the strong PMOS caused by the process effect.

When there is normal PMOS, the output of NOR gate 92 is low such that transistor P35 is on, which adds transistor P34 to inverter 96, and the output of NAND gate 94 is high such that transistor P32 is off, which removes transistor P33 from inverter 96. Adding only transistor P34 retains the balance where the process effect has not caused transistors to leave a normal range.

Finally, when there is weak PMOS, the output of NOR gate 92 is high such that transistor P35 is off, which removes transistor P34 from inverter 96, and the output of NAND gate 94 is high such that transistor P32 is off, which removes transistor P33 from inverter 96. Adding neither transistor P33 nor transistor P34 compensates for the weak PMOS caused by the process effect.

Such compensation in circuit block 81 of compensation circuit 80 can be implemented to use circuit block 91 as delay logic. The delay of this delay logic is automatically adjusted according to the process variation in the semiconductor components. In addition, multiple additional delay blocks like circuit block 91 can be connected in series to further add to the delay. Delay blocks 97, 98 and 99 illustrate further delay blocks, and may be configured similarly to circuit block 91.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A process variation compensation circuit comprising:
   a threshold voltage detector circuit configured with at least one transistor that is manufactured during a process, the threshold voltage detector generating an output signal dependant on variations in the process;
   a comparator network coupled to the threshold voltage detector, the comparator network receiving the output signal and generating at least two responsive logic signals that are indicative of the output signal; and
   a compensation circuit including first and second logic gates each configured to receive the at least two logic signals and a circuit block coupled to the logic gates and including at least one transistor manufactured from the process, the circuit block configured to receive outputs of the logic gates and to adjust the circuit block according to certain outputs of the logic gates, wherein the circuit block is an inverter and wherein the adjustment to the circuit block includes, dependent on the outputs of the logic gates, adding a transistor to or removing a transistor from the inverter.

2. The circuit of claim 1 wherein the threshold voltage detector comprises a NMOS transistor that is manufactured during the process and wherein the output signal varies according to a threshold voltage of the NMOS transistor; and
   wherein the logic gates include an OR gate and an AND gate, and wherein a first transistor is added to the inverter or removed from the inverter dependent on an output of the OR gate and a second transistor is added to the inverter or removed from the inverter dependent on an output of the AND gate.

3. The circuit of claim 2 wherein the threshold voltage detector circuit is an NMOS threshold voltage detector including the NMOS transistor and a reference current configured between a power supply voltage and ground, and wherein the output signal is a threshold voltage signal of the NMOS threshold voltage detector that varies according to the threshold voltage of the NMOS transistor.

4. The circuit of claim 1 wherein the threshold voltage detector circuit comprises a PMOS transistor that is manufactured during the process and wherein the output signal varies according to a threshold voltage of the PMOS transistor; and
   wherein the logic gates include a NOR gate and a NAND gate, and wherein a first transistor is added to the inverter or removed from the inverter dependent on an output of the NOR gate and a second transistor is added to the inverter or removed from the inverter dependent on an output of the NAND gate.

5. The circuit of claim 4 wherein the threshold voltage detector circuit is an PMOS threshold voltage detector including the PMOS transistor and a reference current configured between a power supply voltage and ground, and wherein the output signal is a threshold voltage signal of the PMOS threshold voltage detector that varies according to the threshold voltage of the PMOS transistor.

6. The circuit of claim 1 wherein the comparator network comprises a high and a low comparator, each having a first and second input and an output, and a voltage reference network, wherein the first input of the low comparator receives a first reference voltage from the voltage reference network, the first input of the high comparator receives a second reference voltage from the voltage reference network, the second input of both the high and low comparators receive the output signal from the threshold voltage detector circuit, and wherein the high and low comparators each generate high and low logic signals representative of a comparison of a reference voltage and the output signal.

7. The circuit of claim 6 wherein a normal range is established between the first reference voltage and the second reference voltage such that when the output signal is between the first and second reference voltages high and low logic signals indicate that the output signal is in normal range.

8. The circuit of claim 7 wherein no adjustment is made to the circuit block when the output signal is in the normal range.

9. The circuit of claim 7 wherein an adjustment is made to the circuit block when the output signal is not in the normal range.

10. The circuit of claim 1 wherein the circuit block is an inverter and wherein the adjustment to the circuit block includes adding a transistor to the inverter when the logic signals indicate that the threshold detector has detected a low output signal.

11. The circuit of claim 1 wherein the circuit block is an inverter and wherein the adjustment to the circuit block includes removing a transistor from the inverter when the logic signals indicate that the threshold detector has detected a high output signal.

12. The circuit of claim 2 wherein the first transistor and the second transistor are added to the inverter when there is weak NMOS as a result of process effect, the first transistor is added to and the second transistor is removed from the inverter when the process effect has not caused transistors to leave a normal range and the first transistor and the second transistor are removed from the inverter when there is strong NMOS as a result of process effect.

13. The circuit of claim 4 wherein the first transistor and the second transistor are added to the inverter when there is strong PMOS as a result of process effect, the first transistor is added to and the second transistor is removed from the inverter when the process effect has not caused transistors to leave a normal range and the first transistor and the second transistor are removed from the inverter when there is weak PMOS as a result of process effect.

14. A method of compensating for process variation of semiconductors in a circuit comprising:
   detecting a threshold voltage of a circuit including at least one semiconductor that is manufactured during a process;
   comparing the detected threshold voltage with known voltages;
   generating at least two logic signals that are indicative the comparison of the of the threshold voltage with known voltages;
   receiving the at least two logic signals by each of first and second logic gates; and
   adjusting a circuit block based on outputs of the logic gates, wherein the circuit block includes at least one transistor that is manufactured from the process, wherein the circuit block is an inverter and wherein the adjustment to the circuit block includes, dependent on the outputs of the logic gates, adding a transistor to or removing a transistor from the inverter.

15. The method of claim 14 wherein detecting the threshold voltage of a circuit includes detecting a threshold voltage signal of a circuit including a NMOS transistor that is manufactured during the process and wherein the threshold voltage signal varies according to a threshold voltage of the NMOS transistor.

16. The method of claim 14 wherein detecting the threshold voltage of a circuit includes detecting a threshold voltage signal of a circuit including a PMOS transistor that is manufactured during the process and wherein the threshold voltage signal varies according to a threshold voltage of the PMOS transistor.

17. The method of claim 14 wherein a normal range is established between a first known voltage and a second known voltage such that logic signals indicate that the detected threshold voltage is in normal range when the detected threshold voltage is between the first and second known voltages.

18. The method of claim 17 wherein no adjustment is made to the circuit block when the detected threshold voltage is in the normal range.

19. The method of claim 17 wherein an adjustment is made to the circuit block when the detected threshold voltage is not in the normal range.

20. The method of claim 14 wherein adjusting a circuit block includes adding a semiconductor to the circuit block when the logic signals indicate that a low threshold voltage was detected.

21. The method of claim 14 wherein adjusting a circuit block includes removing a semiconductor to the circuit block when the logic signals indicate that a high threshold voltage was detected.

* * * * *